United States Patent
Tudisco et al.

(10) Patent No.: US 11,719,832 B2
(45) Date of Patent: Aug. 8, 2023

(54) SILICON CARBIDE IONIZING RADIATION DETECTOR

(71) Applicant: Istituto Nazionale di Fisica Nucleare, Frascati (IT)

(72) Inventors: Salvatore Tudisco, Frascati (IT); Francesco La Via, Frascati (IT); Giada Petringa, Frascati (IT); Giuseppe Antonio Pablo Cirrone, Frascati (IT); Sebastiana Maria Regina Puglia, Frascati (IT)

(*) Notice: Subject to any disclaimer, the term of this patent is extended or adjusted under 35 U.S.C. 154(b) by 159 days.

(21) Appl. No.: 17/257,575

(22) PCT Filed: Jun. 28, 2019

(86) PCT No.: PCT/IB2019/055491
§ 371 (c)(1),
(2) Date: Jan. 3, 2021

(87) PCT Pub. No.: WO2020/012288
PCT Pub. Date: Jan. 16, 2020

(65) Prior Publication Data
US 2022/0128712 A1 Apr. 28, 2022

(30) Foreign Application Priority Data
Jul. 12, 2018 (IT) .................... 102018000007139

(51) Int. Cl.
| G01T 1/02 | (2006.01) |
| H01L 31/0312 | (2006.01) |
| H01L 31/117 | (2006.01) |
| H01L 31/18 | (2006.01) |

(52) U.S. Cl.
CPC .......... *G01T 1/026* (2013.01); *H01L 31/0312* (2013.01); *H01L 31/117* (2013.01); *H01L 31/1812* (2013.01)

(58) Field of Classification Search
CPC ... G01T 1/026; H01L 31/0312; H01L 31/117; H01L 31/1812
See application file for complete search history.

(56) References Cited

U.S. PATENT DOCUMENTS

| 2010/0140489 | A1 | 6/2010 | Valvo | |
| 2017/0363755 | A1* | 12/2017 | Ottaviani | .................. G01T 3/08 |
| 2018/0315882 | A1* | 11/2018 | Schulze | .............. H01L 31/0288 |

FOREIGN PATENT DOCUMENTS

EP 0730304 9/1996

OTHER PUBLICATIONS

Torrisi, Lorenzo et al., "Silicon Carbide for Realization of 'Telescope' Ion Detectors", IEEE Transactions on Electron Devices, IEEE Service Center, Piscataway, NJ, vol. 63, No. 11, Nov. 1, 2016, pp. 4445-4451 Figs. 1a, 2a.

* cited by examiner

Primary Examiner — Hugh Maupin
(74) Attorney, Agent, or Firm — Themis Law (57) ABSTRACT

The present invention relates to a silicon carbide telescopic detector for ionizing radiation or a measuring instrument equipped with such a telescopic detector for identifying the type of ionizing radiation and/or measuring a dose released by the radiation, a detector production procedure, as well as uses and original methods which use the detector.

16 Claims, 4 Drawing Sheets

SILICON CARBIDE IONIZING RADIATION DETECTOR

BACKGROUND

A dosimeter is a measuring instrument capable of making measurements of the type and/or dose of ionizing radiation. Ionizing radiation refers to the type of radiation that interacts with matter, causing the ionization of the atoms and/or molecules in the radiation receiving medium.

A particular area of application of ionizing radiation is that of radiobiological applications, in which the receiving medium consists of tissues and/or cellular systems of a living system.

The physical characterization of a clinical beam of ionizing radiation used for radiotherapy is carried out by means of particular dosimeters capable of providing a direct or indirect measurement of the dose of radiation absorbed and/or the type of radiation.

In general, ionizing radiation dosimeters are based on the presence of one or more detectors. A detector in this context is an apparatus which, in the presence of an ionizing radiation incident on its active surface (below also called "area") and crossing its active (or sensitive) volume, reacts producing a certain amount of charge within said active volume; this charge, collected and analyzed, may be used to extract a signal useful for the quantitative and qualitative characterization of the radiation (radiation type) which interacted with the detector.

Some modern ionizing radiation dosimeters are those with ionization chambers or solid-state (silicon, diamond) detectors which, although functional, have a number of drawbacks including, in particular, poor resistance to radiation damage and low accuracy in microdosimetric applications.

One of the main peculiarities of ionizing radiation lies in the discrete character of the mechanisms which regulate their interaction with the material of the receiving medium and, consequently, the deposition of energy. The dose is a macroscopic parameter defined as the ratio of the energy dE released by the ionizing radiation in a medium of mass m: D=dE/dm [Gy]. This dosimetric parameter, which depends on the volume and density of the receiving medium, does not take into account however stochastic fluctuations during the release of radiation energy on a cellular or sub-cellular scale and, although effective in the first approximation, is not an optimum parameter for the purposes of a study of the radiobiological effect.

On this cellular or sub-cellular scale, in fact, volumes of the receiving medium are considered on a micrometric and nanometric scale, where there are low local dose deposits due to high LET (Linear Energy Transfer) particles defined as energy released by the particles in a linear path, along an X-axis, in the receiving medium LET=dE/dx [KeV/μm], so that the dose value as defined above, necessarily resulting from an average or integration of the energy released in a medium of mass m, does not provide sufficiently detailed information about the interaction of radiation at the cellular or sub-cellular level.

In this context, there is a particular pressing need to introduce measurement devices and methods which can more accurately describe, both quantitatively and qualitatively, the local energy deposits resulting from the application of ionizing radiation in regions with a scale smaller than those which are generally of interest in radiotherapy. The study of such parameters is that precisely performed by microdosimetry.

Microdosimetry therefore deals with the study of the effect of ionizing radiation on a receiving medium of micro and/or nanometric scale. In particular, microdosimetry seeks to quantify local energy deposits by correlating them to the biological effects observed on complex cellular systems and introducing new parameters and specific physical concepts such as, for example, the aforementioned LET, which allows characterization of the radiation in terms of local energy deposition in the thickness of the medium.

In the context of microdosimetry, the identification of the type of radiation is therefore also an important aspect, and it is known that this can be achieved by means of a detector called telescope, consisting of two or more detector stages placed in sequence and correlating two pieces of information: the loss of energy $\Delta E$ of an incident particle, measured by a first thin detector, and the residual energy E of the particle, measured by a second, thicker detector, placed sequentially downstream of the first detector.

The Bethe-Bloch formula confirms the dependence, on the atomic number z of the particle incident on this configuration of sequential detectors (telescope), of the product between the information on the loss of energy $\Delta E$ and the information on the residual energy E, $\Delta E \, E = z^2$. This correlation allows the identification of the atomic number of the incident particle, for example by constructing a two-dimensional plot on the axes of which the correlations of the variables E, $\Delta E$ are shown. Ultimately, a telescopic detector consisting of two or more detection stages placed in sequence is a suitable instrument for identifying the type of radiation.

The technical problem which is posed is therefore that of providing an improved detector which solves or at least limits the aforementioned problems of the art and is in particular able to provide a signal which can be used to identify the atomic number of a radiation incident on it and/or to measure the dose thereof released, preferably also for applications involving thicknesses (2-100 μm) and/or volumes of the receiving medium on a micrometric scale.

In the context of this problem, preferably the detector should be easy and inexpensive to produce and be able to be easily used in dosimetry and/or microdosimetry, in particular for radiobiological applications.

Another desirable aspect is that the detector should have a good resistance to radiation damage.

There is also the technical problem of creating a measuring instrument capable of providing a reliable measurement of the atomic number and/or the state of charge of the radiation incident on the detector and/or measuring the dose thereof which is released.

These results are obtained according to the present invention by a monolithic telescopic detector according to the characteristic features of claim 1 and a measuring instrument according to claim 10.

A further subject of the present invention is a procedure for the production of the detector, a method for measurement using the measuring instrument, as well as the use of the instrument in radiobiological applications.

Further details may be obtained from the following description of non-limiting examples of embodiment of the subject of the present invention, provided with reference to the attached drawings, in which.

In general, a first aspect of the present invention refers to a telescopic detector capable of providing a signal useful for identifying the atomic number and/or charge state of an ionizing radiation incident on an active area, and/or measuring a dose of radiation released by said incident radiation, in particular also on thicknesses (2-100 µm) and/or active volumes which are micrometric. Preferred uses of the telescopic detector are in dosimetric and microdosimetric applications, particularly in the field of radiobiological applications.

Figure 1:
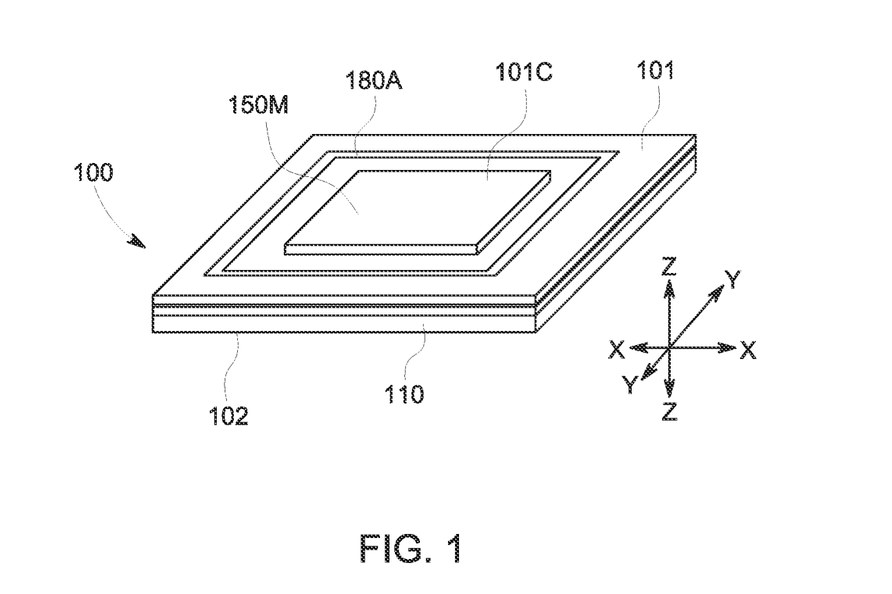
FIG. 1 shows a prospective schematic view of a first example of embodiment of a telescopic detector according to the present invention.
Figure 2:
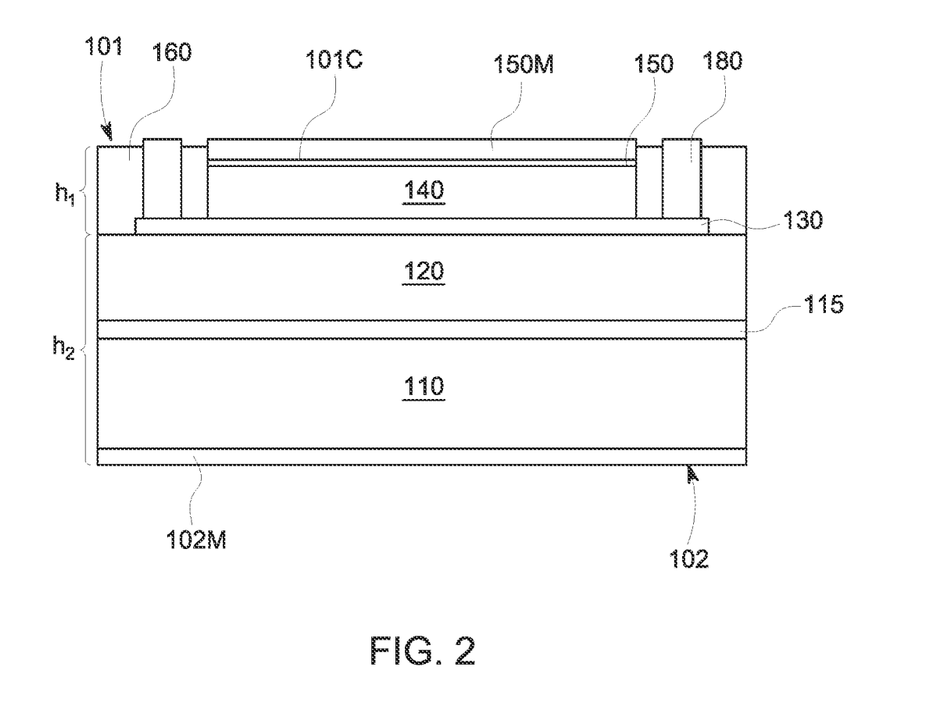
FIG. 2 shows a cross-sectional view along a vertical plane, parallel to the direction of thickness of the detector according to FIG. 1.

With reference to FIGS. 1-2 and assuming solely for convenience of description and without limiting meaning a set of three reference axes respectively in a longitudinal direction X-X of the detector width, transverse direction Y-Y of the detector depth and vertical direction Z-Z of the detector thickness, a preferred embodiment of a detector according to the present invention comprises a monolithic body 100 with an multilayer planar structure extending between an upper face 101, on which there is defined an active surface (hereinafter also area) 101C of the detector, and a lower face 102, opposite to the upper face 101 in the vertical direction Z-Z of thickness of the detector.

A substrate 110 consisting of silicon carbide, preferably SiC-4H or SiC-6H, is placed in a position next to the lower face 102 in the vertical direction and in electrical contact with at least one metal part 102M thereof so as to provide a second stage cathode contact, the function of which will become clearer below.

Starting from substrate 110, in the direction along the vertical axis Z-Z towards the upper face 101, there are arranged at least:

a first n⁻ type epitaxial layer 120, arranged between the substrate and the upper face and having a thickness between 10 and 100 µm, with a concentration of dopant of the order of $5\text{-}8 \cdot 10^{13}/cm^3$;

a second p⁺ type epitaxial layer 130, arranged on top of the first n⁻ type layer 120, having a smaller thickness than the latter, in particular between 0.2 and 1 µm, and a dopant concentration of the order of $10^{18}\text{-}10^{19}/cm^3$;

a third n type epitaxial layer 140, arranged on the second p⁺ type layer 130 and having a thickness of between 2 and 10 µm and dopant concentration of $5\text{-}8 \cdot 10^{13}/cm^3$ and a fourth thin n⁺ type epitaxial layer 150 with a thickness of between 100 nm and 1 µm, preferably 0.2-1 µm, with dopant concentration of the order of $10^{18}/cm^3$, the upper surface of which constitutes the active area 101C of the detector, and is suitable for contact with a metal contact 101M arranged on the upper face 101 so as to provide a first stage cathode contact, the function of which will become clearer below.

Preferably, and as shown in the example, between the substrate 110 and first n⁻ epitaxial layer 120 a buffer layer 115, with a thickness of 1-5 microns is arranged, said layer being designed to reduce any defects in the substrate that could propagate into the epitaxial layer.

The multilayer planar structure results in a detector configuration with at least two detector stages arranged in sequence along the vertical direction of thickness.

A first detector stage is defined between the top surface of the fourth n⁺ type layer 150 and the bottom surface of the second p⁺ type epitaxial layer 130 and also comprises the third layer 140.

A second detector stage extends between the top surface of said second layer 130 at least up to the bottom surface of the SiC substrate 110, and comprises the first n⁻ type epitaxial layer 120.

In the preferred configuration shown, the first detector stage will therefore have a cathode in contact with the fourth n⁺ type layer 150 and an anode in contact with the second p⁺ type layer 130, while the second detector stage will have a cathode in contact with the silicon carbide substrate and an anode in contact with said second p⁺ type layer 130 which is shared with said first detector stage.

In other words, the preferred embodiment of the detector shown in FIGS. 1 and 2 has a double n-p, p-n junction with a common p region consisting of said second p⁺ layer 130.

The dopant may be any known dopant, preferably nitrogen and/or phosphorus as n-type dopants and aluminium as p-type dopant. The epitaxial layers are also made of silicon carbide, the structure being monolithic.

The active volume of the first detector stage consists of the sum of the volumes of the layers included between the top surface of the fourth layer 150 and the bottom surface of the second layer 130; in the preferred example shown, it therefore comprises the volumes of the fourth layer 150, the third layer 140 and the second layer 130.

The active volume of the second detector stage extends from the top surface of the second layer 130, which forms the active area thereof, to the bottom of the substrate 110, and comprises all the volumes between said surfaces.

For the purposes of this description, the active volume of the detector means the sum of the active volumes of said at least first and second detector stages.

The thickness h1 of the active volume of the first detector stage measured between the top surface of the fourth layer 150 and the bottom surface of the second layer 130 is preferably between 2 and 10 micrometres, while the thickness h2 of the second detector stage measured between the top surface of the second layer 130 and the bottom surface of the substrate 110 is preferably between 10 and 100 micrometres.

As shown in FIG. 2, in the preferred example of embodiment, the substrate 110, the optional buffer layer 115 and the first n-type epitaxial layer extend in the longitudinal direction X-X and transverse direction Y-Y beyond the extension of the active area 101C of the first detector stage.

The second p⁺ type epitaxial layer 130, on the other hand, preferably has a longitudinal and transverse extension smaller than that of the first n⁻ type layer 120. The third n⁻ type layer 140 and the fourth n⁺ type layer 150 in turn have an extension in the longitudinal direction X-X and transverse direction Y-Y smaller than that of the second p⁺ type epitaxial layer 130 on which they are arranged.

With this configuration, it is possible to arrange a layer 160 of $SiO_2$ in the peripheral region outside the layers arranged between the first layer 120 and the front surface 101, in particular around said second layer 130, third layer 140 and fourth layer 150, with the function of electrical insulation.

A metal contact 180 can also be extended in the vertical direction Z-Z from the front face 101 to the second p⁺ type epitaxial layer 130, in the peripheral region outside the third n⁻ type layer 140 and fourth layer 150, so as to provide on the front face 101 an anode contact 180A electrically connected to the second layer p⁺ type epitaxial layer 130 which forms the common anode of the two detector stages.

According to preferred embodiments, the detector may be improved with special measures known per se in the sector of planar semiconductor structures, in particular edge structures are preferably provided for reduction of the lateral electric field and/or shaping of the field.

On the front face of the device there is also arranged a metal contact 150M arranged above and in contact with the fourth n⁺ type layer 150 and designed to form the cathode contact of the first detector stage on the front face 101 of the detector in order to facilitate sampling of an output signal of the first detector stage.

Similarly, the metal contact 102M on the rear face 102 of the detector facilitates the sampling of the output signal from the cathode contact of the second detector stage.

With reference to the operation of the detector, a current and/or charge signal may therefore be sampled from the cathode contact 150M of the first detector stage, said signal being useful for quantifying the loss of energy $\Delta E$ of the ionizing radiation beam incident on the active area 101C and passing through the active volume of the first detector stage.

From the cathode 102M of the second detector stage, a current and/or charge signal may instead be sampled in order quantify the residual energy E of the incident radiation after crossing the first detector stage.

Figure 3:
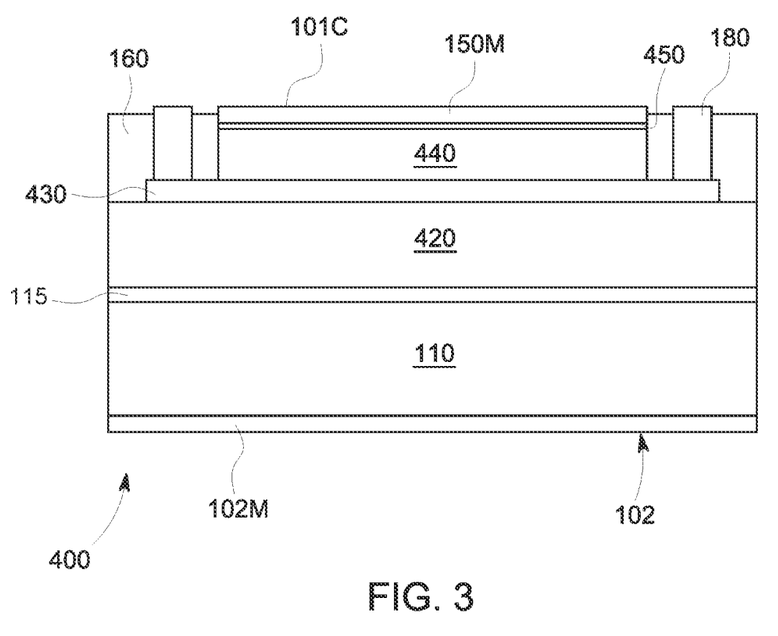
FIG. 3 shows a cross-sectional view along a vertical plane, parallel to the thickness direction, of a second example of embodiment of a detector according to the invention.

As shown in FIG. 3, where parts which are the same maintain the same reference numbers, a variation of embodiment 400 of the detector according to the invention is configured to obtain the two detector stages with a common cathode, in contact with a second n⁺ type layer 430, and two end anodes respectively in contact with a fourth p⁺ type epitaxial layer 450 and with the SiC substrate 110.

In this alternative configuration, the doping of the intermediate layers is to be understood as inverted with reference to the n type and p type dopants, and therefore involves a first p⁻ type layer 420, a second n⁺ type layer 430, a third p⁻ type layer 430 and a fourth p⁺ type layer Therefore, in this case, the multilayer structure has a double p-n, n-p junction with a common n region formed by said second n⁺ type layer 430.

It is understood that in this configuration the metal contact 150M provides the first stage anode contact, the metal layer 102M a second stage anode contact and the metal connection 180 a cathode contact for the common buried cathode 430, the first and second stage signals being able to be sampled from the respective anode contacts in the same way as described above.

The detector of the present invention may be advantageously realized in various configurations with different dimensions and/or geometries: for example, the active area 101C may assume a square, rectangular or multiple strip geometry. For a preferred application in the context of microdosimetry measuring instruments the active area 101C of the detector is of the order of hundreds of $\mu m^2$, preferably 10-500 $\mu m^2$.

In a further preferred configuration for more conventional dosimetric applications, the active area of the detector may be of the order of a few $cm^2$, preferably 500 $\mu m^2$-10 $cm^2$.

An advantage of the detector structure of the present invention is that it allows a plurality of detectors to be incorporated in two-dimensional arrays, so as to form for example pixel devices for imaging applications.

Compared to more modern dosimeters and microdosimeters, such as those with ionization chambers, or with solid-state (silicon, diamond) detectors, the silicon carbide detector according to the invention is very resistant to radiation damage, certainly superior in particular to those with ionization chambers and silicon devices. SiC is a material resistant to radiation damage and is therefore able to withstand intense particle flows.

A further advantage of silicon carbide is the fact that it is a biocompatible material and therefore it is possible to provide detectors which come into contact with biological tissues.

In addition, SiC detectors have the advantage of being able to exploit most silicon processing technologies, something which makes them particularly flexible for the construction of complex devices and geometries (pixel array) and/or devices with large dimensions, this being an advantage compared to gas detectors and/or diamond devices.

As will become clearer below, the detector according to the present invention is able to provide an output signal which can be easily acquired and processed, particularly for dosimetric applications, in response to a radiation incident on its active area. The detector's response characteristic will be analyzed in more detail below.

Construction Method

A preferred method for the construction of the detector according to the present invention comprises the following steps:
  formation of a monolithic multilayer planar structure extending between an upper face 101, and a lower face 102, by means of:
  preparation of a substrate made of SiC, preferably SiC-4H or SiC-6H;
  deposition on the substrate of a series of epitaxial layers, comprising at least:
    a first n⁻ type or p⁻ type epitaxial layer, having a thickness of a few tens of microns (10-100 $\mu m$), with a dopant concentration of the order of $5\text{-}8 \cdot 10^{13}/cm^3$;
    a second p⁺ or n⁺ type epitaxial layer, with a thickness (0.2-1 $\mu m$) smaller than that of the first layer and with dopant concentrations of the order of $10^{18}\text{-}10^{19}/cm^3$, obtaining a first n-p or p-n junction;
    a third n⁻ or p⁻ type layer, deposited on the second layer, with a thickness of between 2 and 10 $\mu m$ and dopant concentration of the order of $5\text{-}8 \cdot 10^{13}/cm^3$; and
    a fourth n⁺ or p⁺ type layer with a thickness of 0.1-1 $\mu m$, preferably 0.2-1 $\mu m$, deposited on the third n⁻ or p⁻ type layer, and having a dopant concentration of the order of $10^{18}/cm^3$, therefore within the range of 1 and $9.9*10^{18}$, the top surface of which forms the active area on the front face of the detector.

The monolithic multi-layer structure formed gives rise to at least two detector stages in sequence along the vertical direction of thickness, the first detector stage being defined between a cathode and an anode and comprising at least the fourth epitaxial layer, the third epitaxial layer and the second epitaxial layer 130 configured to form a p-n or n-p junction, and the second detector stage, arranged in sequence with the first detector stage in the vertical direction, being defined between a cathode and an anode and comprising at least the second epitaxial layer, the first epitaxial layer and the SiC substrate configured to form an n-p or p-n junction.

The method may also comprise the formation of a first-stage metal contact electrically in contact with the thin fourth layer and/or a metal contact arranged on the upper face and electrically in contact with the second sunken epitaxial layer, and/or a second-stage metal contact arranged on the lower face and electrically in contact with the silicon carbide substrate. Techniques for the formation of such contacts are known in the sector and not described in detail here.

Preferably, the method comprises a further step of machining the front face 101, for example in order to shape the contact 180A, and/or define edge structures for reducing the lateral electric field and/or for shaping the field, preferably performed by means of one or more photolithographic processes, preferably simultaneously in a single photolithographic process.

Dosimeter

The present invention relates furthermore to a measuring instrument comprising at least one detector according to the invention and configured to provide information about the type of radiation and/or a measurement of the radiation dose released by an ionizing radiation incident on at least one detector, based on the output signal of one or more stages of the at least one detector. For the purposes of this description, such a measuring instrument will also be referred to as a dosimeter.

The dosimeter may provide information about the type of radiation and/or a measurement of the radiation dose released both by a single incident charged particle (single event) and by a stream of ionizing radiation.

Figure 4:
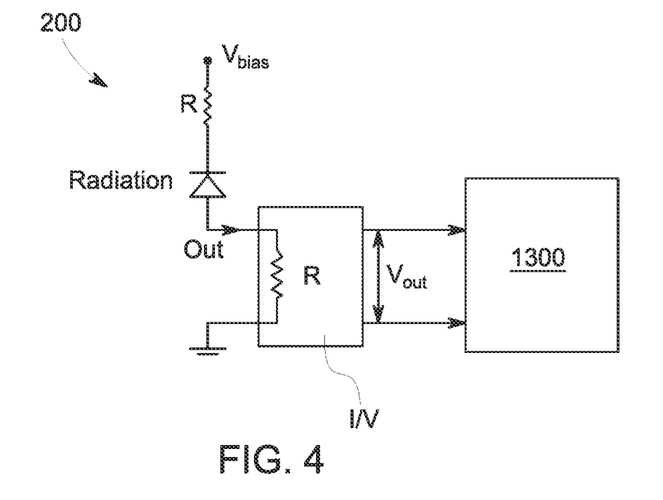
FIG. 4 shows a schematic representation of a first example of a measuring instrument according to the invention for measuring a released dose by means of reading of a signal output by a detector stage of the telescopic detector of FIG. 1.

With reference to FIG. 4, this figures shows an example of a circuit configuration which allows easy reading of the output signal of one of the two detector stages, for convenience of description described with reference to the embodiment 100 of FIG. 1 of the detector.

By connecting a polarization network 200 powered by a bias voltage $V_{Bias}$ to the cathode of the detector stage, the active region (volume) of the stage is emptied, with generation of a current signal $i_{out}$ output by the detector stage. A current/voltage I/V converter, connected to the detector stage cathode and to ground, also allows the acquisition and conversion of the current signal into an output voltage signal Vout which may be acquired, digitized and processed for the desired application by suitable processors 1300, for example configured to measure the current or the dose D of energy released in the active volume of the detector stage, based on the acquired output voltage signal. This configuration for reading of the output signal can be applied to one and/or the other of the detector stages, depending on the active volume desired for the dose measurement.

For example, in order to measure the radiation dose released in the active volume of a detector stage, defined as the energy released per unit of mass, it is possible to measure the LET (i.e. the energy released per unit of thickness of the detector stage) based on the output signal of a stage as described above. To determine the dose from the LET it is then sufficient to divide it by the active area of the detector stage and take into account the density of the detector material (the density of a preferred embodiment being 3.21 g/cm$^3$): D=LET/(Active area*material density).

Depending on the desired measurement scale, the first stage with a smaller thickness or the second stage with a greater thickness may be used, it being therefore possible to carry out the measurement on an active volume of micrometric scale.

The configuration described here is therefore a first example of embodiment of a measuring instrument according to the invention.

Figure 5:
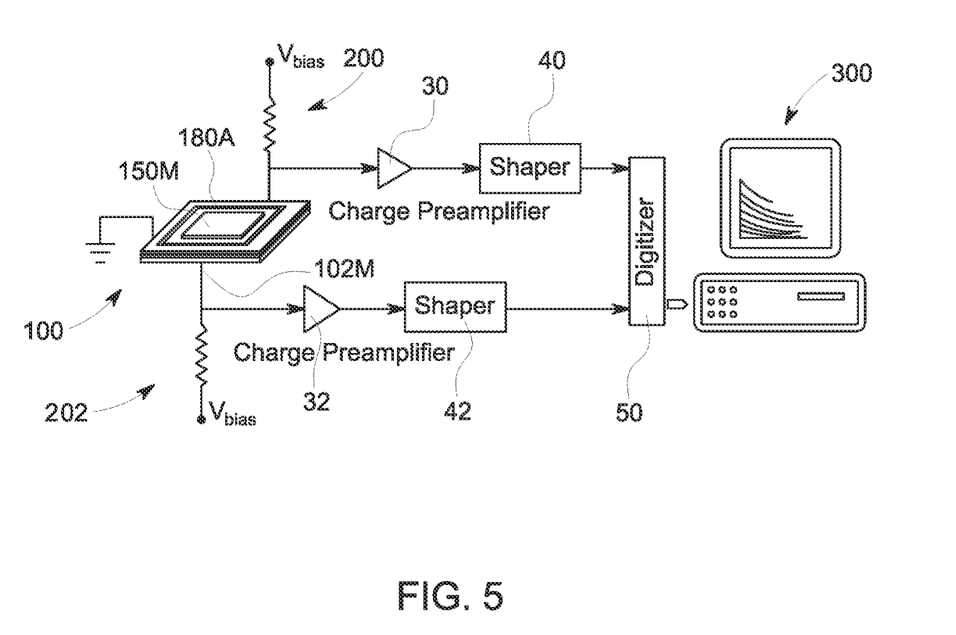
FIG. 5 shows a schematic view of a second example of a measuring system comprising a detector according to the invention.

With reference to FIG. 5, there now follows a description of a further example of embodiment of a measuring instrument comprising a detector 100 according to the invention, in particular the detector described above with reference to FIGS. 1-2, the common anode 180A of which is connected to ground, while each cathode 150M, 102M of the first and second detector stage is connected to a respective polarization network 200, 202.

The exponential charge pulse output by the cathode of each detector stage is then sent to a respective charge preamplifier 30, 32 and then to one or more respective shaper amplifiers 40, 42 configured to transform the exponential pulse output by the detector stage into a Gaussian pulse suitable for subsequent acquisition and digitization by a digitization module 50 arranged downstream of the amplifiers 40, 42.

The measuring instrument also comprises processing means 300 for processing the digitized signals so as to provide the desired data for the specific application and in particular an identification of the type of radiation incident on the detector (e.g. atomic number z calculated using the Bethe-Bloch formula).

Generally the processing means 300, 1300 may consist of an electronic processor having suitable firmware and/or software.

With this configuration, the dosimeter operates as follows:
when a bias voltage $V_{bias}$ is applied to each polarization network 200, 202, the polarization network determines the formation of the emptying regions or active regions in the respective first or second detector stage;
an ionizing radiation incident on the active surface of the detector generates a quantity of charge in the active volume of each stage, which is proportional to the energy released by the radiation when crossing the same;
the passage of the single particle of ionizing radiation through the first and second detector stages generates a respective first or second stage charge pulse output by the contact 150M, 102M of the stage.
the charge pulse of each stage is amplified by the charge preamplifier and converted into Gaussian form by the respective shaper amplifier 40, 42;
the train of Gaussian pulses thus generated may then be acquired by the module 50 and processed by the processing means 300 configured to provide the desired measurement.

Examples of specific methods for processing the signal aimed at obtaining a measurement of the atomic number z and/or the dose released are known in the sector and for example may be found in the publication G. F. Knoll, "Radiation Detection and Measurement," John Wiley & Sons, New York, 2010.

In the case of a plurality of detectors arranged in a two-dimensional matrix so as to form, for example, a "pixel" system for imaging applications, either of the configurations described for the acquisition and digitalization of the respective output signals may be repeated for each detector, and the acquired signals supplied to processing means which may be common to all the detectors.

Experimental Tests and Characterization of the Detector Response

The response of a large-size prototype dosimeter device was verified with 62 MeV clinical proton beams at the CATANA proton therapy facility (Centre for Hadrontherapy and Advanced Nuclear Applications) of the Southern National Laboratories (LNS-INFN). The detector used was a prototype made in accordance with the embodiment shown in FIG. 1-2 and with an active area of 1 cm$^2$ and thickness h1 of the first detector stage equal to 10 μm.

In order to adequately characterize the detector response for dosimetric and microdosimetric applications, a series of preliminary tests were conducted with variation of the dose deposit released to the device, the fluence of the incident particles and their energy.

The detector was configured according to the circuit diagram shown in FIG. 4, so as to read only the output signal Vout of the first detector stage, representing the energy lost by the incident beam when crossing the active volume of the first detector stage ΔE.

The device was subjected to direct ion radiation by a beam of protons, positioned at the isocentre, and passing through a collimator of 5 mm diameter arranged in such a way as to centre the active area of the detector.

Detector Response to Variations of Released Dose Amount and Variation of the Delivered Dose Rate The charge collected by the first stage detector was measured for variations in the dose delivered. In particular, by positioning the detector at the isocentre, different dose values were delivered using a 62 MeV monochromatic beam of incident protons.

The output signal from the first detector stage was normalized for the signal acquired by means of beam monitoring with a SEM (Secondary Emission Monitor) installed at the CATANA irradiation facility. This detector provides on-line information about variations in the proton current supplied. In this way, it was possible to study the variation of the charge signal collected at the output of the detector stage, making it independent of possible variations in the particle stream delivered.

Figure 6:
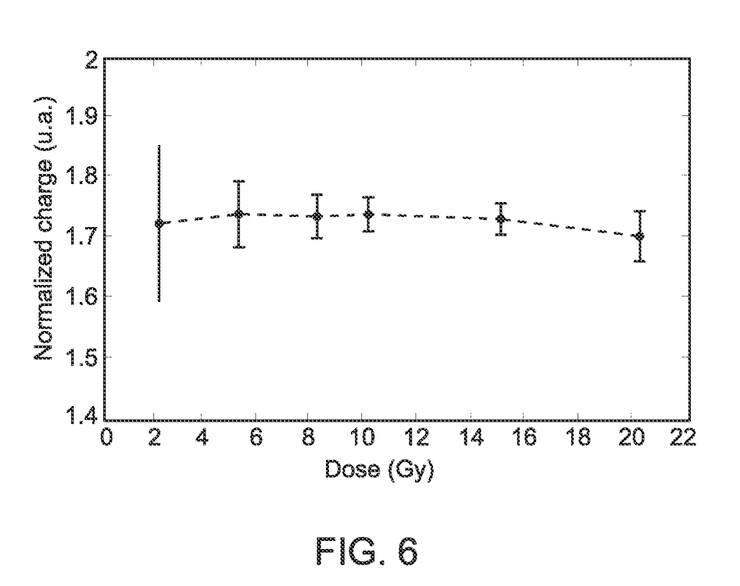
FIG. 6 shows a graph of the response of a detector according to the invention expressed in nC and normalized for the SEM monitoring signal as a function of the dose delivered. The error is calculated by means of propagation of standard deviation errors on an average of 20 samples.

The detector response, expressed in nC and normalized for the SEM monitoring signal as a function of the dose delivered, is shown in FIG. 6; the error shown in FIG. 6 is calculated by means of propagation of the errors of the standard deviation on an average of 20 samples.

The charge collected by the detector showed a good independence from the dose rate with a reproducibility within 2%. As can be seen from FIG. 7, the detector has in fact a linear response to the variation of the dose delivered within a variation of 2%. This response is in accordance with the dosimetric standards stipulated by IAEA for clinical irradiation with protons.

One of the crucial elements in the dosimetric characterization of a detector is the study of the detector response to a variation in the dose rate delivered. At the CATANA facility, the response of the device to the variation of three different values of dose rate (or particle stream delivered) was therefore studied using a 62 MeV monochromatic clinical beam of protons. In particular, 11 Gy/min, 20 Gy/min and 30 Gy/min were chosen as dose rate values.

Figure 7:
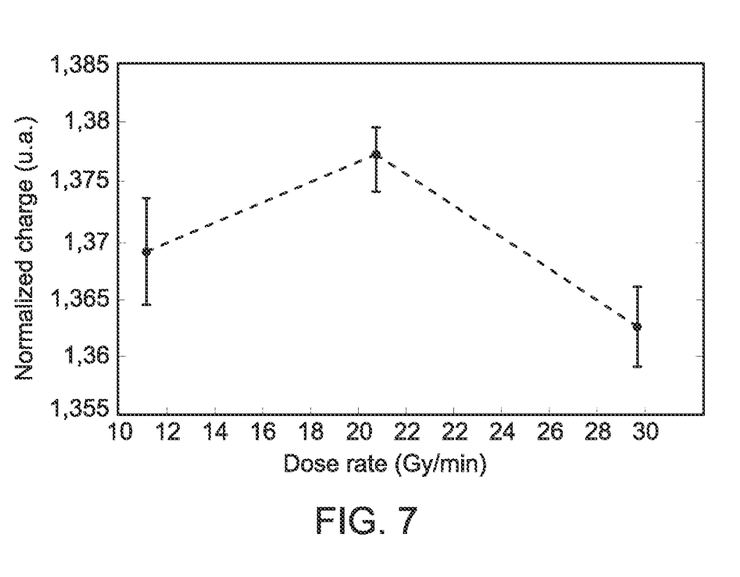
FIG. 7 shows a graph of the response of a detector according to the invention expressed in nC and normalized for the SEM monitoring signal as a function of the dose rate with fixed delivered dose of 6 Gy. The error is calculated by means of propagation of standard deviation errors on an average of 20 samples.

As shown in FIG. 7, which shows the detector response expressed in nC and normalized for the SEM monitoring signal as a function of the dose rate, with a fixed delivered dose of 6 Gy, the detector showed in this case also a low dependence on the flow of incident particles and the maximum percentage variation measured upon variation of the delivered dose rate delivered was of the order of 0.95%.

It can therefore be seen how the detector according to the present invention has an excellent performance in terms of linearity and independence from the dose rate when used as a detector in instruments for measuring the type or dose of ionizing radiation delivered, in line with the dosimetric standards of the reference sector.

The detector is also resistant to radiation damage, easy and inexpensive to produce and may be easily realized in different configurations even with multiple detectors arranged in a matrix, thus allowing great versatility of application.

The telescopic structure constructed using monolithic technology has the additional advantage of making the detector realizable on micrometric scales both in terms of active surface area and thicknesses of the first and second stages, while the combination of silicon carbide with the specific epitaxial layers of the invention allows a good linearity and suitable response times also for individual particle measurement to be obtained.

The detector and the measuring instrument according to the invention are therefore suitable for microdosimetric applications, being able to provide a measurement of the dose released on micrometric volumes and thicknesses and/or the identification of the type of radiation incident on the active area for each event.

The detector is therefore particularly suitable also for use in direct dosimetry and microdosimetry of intense clinical beams.

The invention claimed is:

1. A detector for ionizing radiation, configured as a telescopic detector with at least two detector stages, the detector comprising a monolithic body formed by a multilayer planar structure which comprises:
   an upper face comprising an active area of the detector and a lower face, opposite to the upper face in a vertical direction (Z-Z) of thickness of the detector;
   a substrate consisting of SiC, adjacent to the lower face in the vertical direction (Z-Z);
   a first epitaxial layer that is a n$^-$ or p$^-$ type epitaxial layer (120, 420), arranged between the substrate and the upper face and having a thickness of between 10 and 100 μm, with a dopant concentration of about $5\text{-}8\cdot10^{13}$/cm$^3$;
   a second epitaxial layer that is a p$^+$ or n$^+$ type epitaxial layer (130, 430), arranged on top of the first epitaxial layer and having a thickness smaller than the thickness of the first epitaxial layer, with a dopant concentration of about $10^{18}\text{-}10^{19}$/cm$^3$;
   a third epitaxial layer that is a n$^-$ or p$^-$ type epitaxial layer (140, 440), arranged on the second epitaxial layer and having a thickness of between 2 and 10 μm and dopant concentration of about $5\text{-}8\cdot10^{13}$/cm$^3$; and
   a fourth epitaxial layer that is a n$^+$ or p$^+$ type epitaxial layer (150, 450), with a thickness of 0.1 to 1 μm, and dopant concentration of about $10^{18}$/cm$^3$, a top surface of the fourth epitaxial layer forming the active area of the detector, the multilayer planar structure resulting in at least one first detector stage defined between a cathode and an anode and comprising at least the fourth epitaxial layer (150, 450), the third epitaxial layer (140, 440) and the second epitaxial layer (130, 430) arranged so as to form a p-n or n-p junction, and a second detector stage arranged in sequence with the first detector stage in the vertical direction (Z-Z), defined between a cathode and an anode and comprising at least the second epitaxial layer (130, 430), the first epitaxial layer (120, 420) and the substrate (110) arranged so as to form an n-p or p-n junction, wherein the first epitaxial layer (120) is of a n− type, the second epitaxial layer (130) is of the p+ type, the third epitaxial layer (140) is of the n− type, and the fourth epitaxial layer (150) is of the n+ type, and wherein the cathode of the first detector stage is in contact with the fourth n+ type epitaxial layer (150) and the anode of the first detector stage is in contact with the second p+ epitaxial layer (130), and the cathode of the second detector stage is in contact with the substrate and the anode of the second detector stage is in contact with the second p+ type epitaxial layer (130), or the first epitaxial layer (420) is of p− type, the second epitaxial layer (430) is of n+ type, the third epitaxial layer (440) is of p− type, and the fourth epitaxial layer (450) is of p+ type, and wherein the anode of the first detector stage is in contact with the fourth p+ type epitaxial layer (450) and the cathode of the first detector stage is in contact with the second n+ type epitaxial layer (430), and the anode of the second detector stage is in contact with the substrate (110) and the cathode of the second detector stage is in contact with the second n+ type epitaxial layer (430).

2. The detector according to claim 1, wherein the detector has the active area of about 10-500 $\mu m^2$ or of about 500 $\mu m^2$-10 $cm^2$.

3. The detector according to claim 1, wherein a thickness h1 in a vertical direction of the first detector stage, measured between the top surface of the fourth epitaxial layer (150, 450) and a bottom surface of the second epitaxial layer (130, 430) is between 2 and 10 micrometers, and/or in that a thickness (h2) of the second detector stage, measured between a top surface of the second layer (130) and a bottom surface of the substrate (110), is between 10 and 100 micrometers.

4. The detector according to claim 1, further comprising a buffer layer (115), arranged between the substrate (110) and the first n− type epitaxial layer (120, 420).

5. The detector according to claim 1, wherein the active area is formed as a quadrilateral, or as a plurality of strips.

6. The detector according to claim 1, further comprising an $SiO_2$ electrical insulation layer (16) arranged in a peripheral region outside layers arranged between the first epitaxial layer (120) and a front surface.

7. A measuring instrument for measuring one or both of an atomic number of or a dose released by an ionizing radiation, comprising:
one or more detectors according to claim 1.

8. The measuring instrument according to claim 7, wherein a plurality of detectors are arranged in one or more rows and/or one or more columns so as to form a matrix of detectors.

9. The measuring instrument according to claim 7, further comprising a processor (1300, 300) configured to provide a measurement of a dose released by an ionizing radiation beam incident on the active area of the one or more detectors, based on an output signal of the first or second detector stage emitted by the one or more detectors in response to the ionizing radiation beam; and/or to provide an atomic number of one or more particles of a stream of incident radiation based on output signals from the first and the second detector stages emitted by said one or more detectors in response to the incident ionizing radiation beam.

10. The measuring instrument according to claim 7, further comprising at least one polarization network powered by a bias voltage, connected to the cathode or the anode of a respective detector stage.

11. A procedure of constructing a detector according to claim 1, comprising:
forming a monolithic multilayer planar structure extending between the upper face, and the lower face (102), by:
preparing the substrate consisting of SiC;
deposing, on the substrate, a series of epitaxial layers, comprising at least:
the first epitaxial layer that is the n− or p− type epitaxial layer, with the thickness of 10-100 μm, and with the dopant concentration of about $5\text{-}8\cdot 10^{13}/cm^3$;
the second epitaxial layer that is the p+ or n+ type epitaxial layer, with the thickness of 0.2-1 μm smaller than the thickness of the first layer and with the dopant concentration of about $10^{18}\text{-}10^{19}/cm^3$;
a third epitaxial layer that is the n− or p− type epitaxial layer, deposited on the second epitaxial layer, and having the thickness of between 2 and 10 μm and the dopant concentration of about $5\text{-}8\cdot 10^{13}/cm^3$; and
a fourth epitaxial layer that is the n+ or p+ type layer with the thickness of 0.1-1 μm, deposited on the third epitaxial layer, and having the dopant concentration of about $10^{18}/cm^3$, the top surface of the fourth epitaxial layer forming the active area on a front face of the detector,
wherein the monolithic multilayer planar structure so formed results in at least two detector stages arranged in sequence along the vertical direction of thickness, the first detector stage being defined between a cathode and an anode and comprising at least the fourth epitaxial layer, the third epitaxial layer and the second epitaxial layer configured to form a p-n or n-p junction, and the second detector stage, arranged in sequence with the first detector stage in the vertical direction, being defined between a cathode and an anode and comprising at least the second epitaxial layer, the first epitaxial layer and the substrate configured to form a n-p or p-n junction,
further comprising a step of machining the front upper face (101) of the detector, so as to define edge structures for reducing a lateral electric field and/or for shaping the lateral electric field and/or for forming a metal contact (180, 180A) for connection to the second epitaxial layer 130.

12. The procedure according to claim 11, further comprising a step of forming a first stage metal contact electrically in contact with the fourth epitaxial layer, and/or a metal contact arranged on the upper face and extending in the vertical direction so as to be electrically in contact with the third epitaxial layer, and/or a second stage metal contact arranged on the lower face and electrically in contact with the substrate.

13. A method of measuring type and/or dose of radiation released by an ionizing radiation beam comprising the following steps:
arranging at least one detector according to claim 1, so that the ionizing radiation beam strikes the active area of the at least one detector;
acquiring an output signal from at least one detector stage of the at least one detector; and producing a measurement of the dose of radiation released by and/or an atomic number of one or more particles of the ionizing radiation beam, based on the acquired output signal.

14. The method according to claim 13, wherein the measurement of the dose is based on the output signal of the first or the second detector stage of the at least one detector, and/or wherein the measurement of the atomic number is provided based on the output signals of both the first stage and the second stage of the at least one detector.

15. The method according to claim 13, further comprising a step of measuring the type and/or the dose of radiation released by the ionizing radiation beam in dosimetry or microdosimetry of clinical beams.

16. A detector for ionizing radiation, configured as a telescopic detector with at least two detector stages, the detector comprising a monolithic body formed by a multilayer planar structure which comprises:
- an upper face comprising an active area of the detector and a lower face, opposite to the upper face in a vertical direction (Z-Z) of thickness of the detector;
- a substrate consisting of SiC, adjacent to the lower face in the vertical direction (Z-Z);
- a first epitaxial layer that is a n− or p− type epitaxial layer (120, 420), arranged between the substrate and the upper face and having a thickness of between 10 and 100 μm, with a dopant concentration of about $5\text{-}8 \cdot 10^{13}/cm^3$;
- a second epitaxial layer that is a p+ or n+ type epitaxial layer (130, 430), arranged on top of the first epitaxial layer and having a thickness smaller than the thickness of the first epitaxial layer, with a dopant concentration of about $10^{18}\text{-}10^{19}/cm^3$;
- a third epitaxial layer that is a n− or p− type epitaxial layer (140, 440), arranged on the second epitaxial layer and having a thickness of between 2 and 10 μm and dopant concentration of about $5\text{-}8 \cdot 10^{13}/cm^3$; and
- a fourth epitaxial layer that is a n+ or p+ type epitaxial layer (150, 450), with a thickness of 0.1 to 1 μm, and dopant concentration of about $10^{18}/cm^3$, a top surface of the fourth epitaxial layer forming the active area of the detector, the multilayer planar structure resulting in at least one first detector stage defined between a cathode and an anode and comprising at least the fourth epitaxial layer (150, 450), the third epitaxial layer (140, 440) and the second epitaxial layer (130, 430) arranged so as to form a p-n or n-p junction, and a second detector stage arranged in sequence with the first detector stage in the vertical direction (Z-Z), defined between a cathode and an anode and comprising at least the second epitaxial layer (130, 430), the first epitaxial layer (120, 420) and the substrate (110) arranged so as to form an n-p or p-n junction,
further comprising a metal contact (180) extending in a vertical direction (Z-Z) from a front face as far as the second epitaxial layer (130, 430), in a peripheral region outside the third epitaxial layer (140, 440) and fourth layer (150, 450), so as to provide on the front face (101) a contact (180A) electrically connected to the second epitaxial layer (130, 430); and/or a metal contact (150M) arranged above and in contact with the fourth epitaxial layer (150, 450); and/or a metal contact (102M) arranged on a rear face (102) of the detector and electrically in contact with the substrate (110).

* * * * *